United States Patent [19]

Hattori

[11] Patent Number: 5,483,555
[45] Date of Patent: Jan. 9, 1996

[54] PHASE ADJUSTING CIRCUIT FOR A DEMODULATOR

[75] Inventor: Shinji Hattori, Higashiosaka, Japan

[73] Assignee: Sharp Kabushiki Kaisha, Osaka, Japan

[21] Appl. No.: 52,703

[22] Filed: Apr. 27, 1993

[30] Foreign Application Priority Data

May 28, 1992 [JP] Japan .................................. 4-137287

[51] Int. Cl.⁶ ...................................................... H03D 3/00
[52] U.S. Cl. ............................ 375/327; 375/344; 329/360
[58] Field of Search .................................... 375/325, 326, 375/327, 344, 373, 375–376; 329/307, 360, 361; 364/724.1

[56] References Cited

U.S. PATENT DOCUMENTS

| | | | |
|---|---|---|---|
| 4,543,600 | 9/1985 | Bolger | 375/373 |
| 4,600,889 | 7/1986 | Rugen | 375/327 |
| 4,672,447 | 6/1987 | Möring et al. | 375/362 |
| 5,084,913 | 1/1992 | Kingston et al. | 375/367 |
| 5,170,368 | 12/1992 | Hattori | 364/724.1 |

*Primary Examiner*—Young Tse

[57] ABSTRACT

A phase adjusting circuit for a demodulator is provided. The circuit comprises an A/D converter for sampling an input analog signal at an interval shorter than the Nyquist interval and converting the sampled analog signal to a digital signal, a digital filter for narrowing the frequency band of the digital signal to output a filtered digital signal, a digital sampling/holding circuit for decimating sampling components of the filtered digital signal to output a decimated digital signal, and a phase locked loop circuit for detecting a phase error of the decimated digital signal and controlling the number of sampling intervals to be skipped by the digital sampling/holding circuit.

11 Claims, 7 Drawing Sheets

PHASE ADJUSTING CIRCUIT FOR A DEMODULATOR

BACKGROUND OF THE INVENTION

1. Field of the Invention

The present invention relates to a phase adjusting circuit for a demodulator used for a facsimile, a modem, or the like.

2. Description of the Related Art

In a facsimile, a modem, or the like using telephone lines for the transmission of signals, analog carrier signals are phase-modulated by digital signals by phase shift keying (PSK) before being transmitted through the telephone lines. Such phase-modulated transmitted signals are often demodulated through a phase locked loop (PLL) circuit where carrier signals generated in the PLL circuit are compared with the transmitted signals so as to be synchronized with them.

Figure 6:
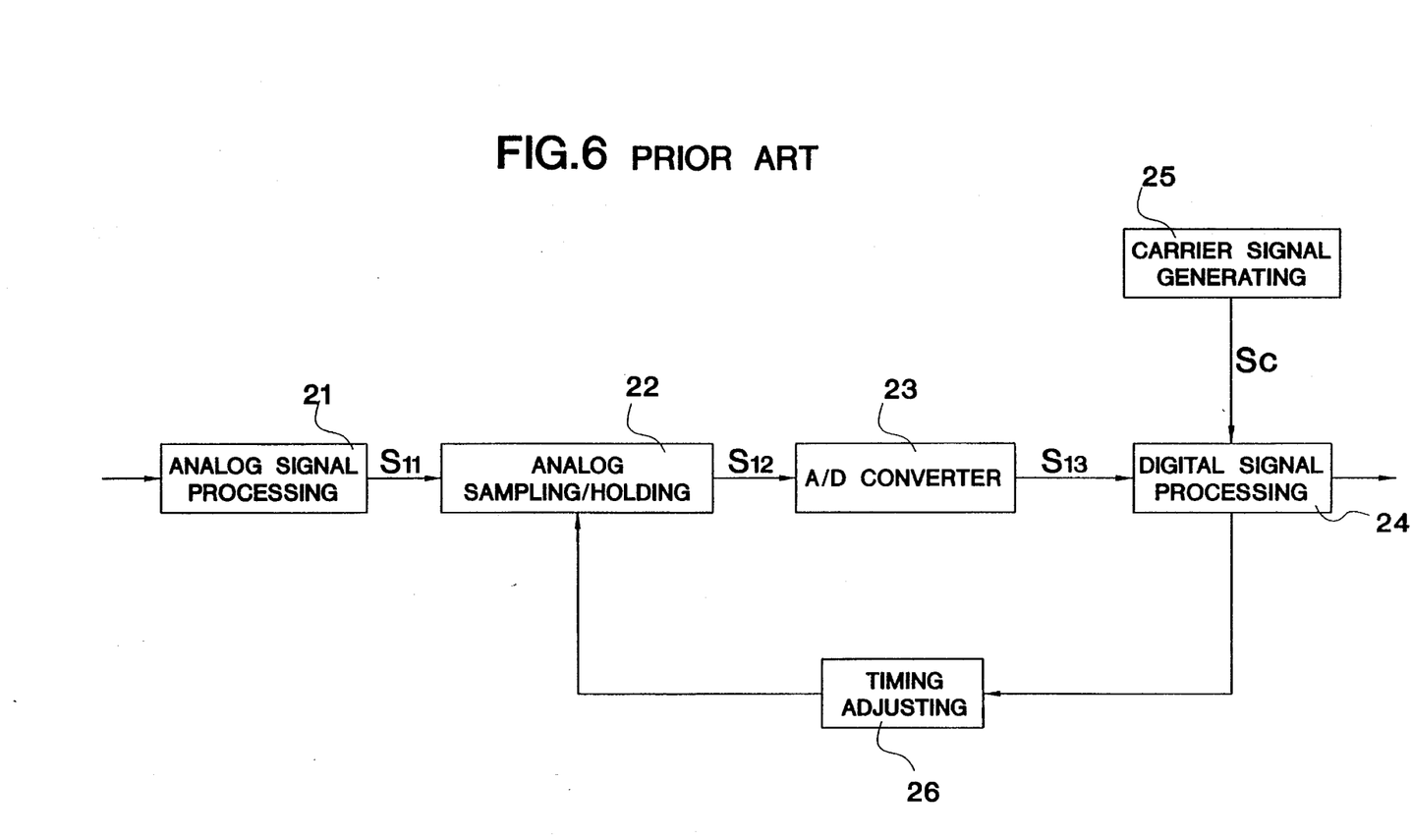
FIG. 6 is a block diagram showing a conventional phase adjusting circuit for a demodulator.

FIG. 6 shows a conventional phase adjusting circuit incorporating such a PLL circuit for a demodulator used for a facsimile, a modem or the like.

An analog signal transmitted to the demodulator is first input to an analog signal processing circuit 21 where the signal is subjected to necessary processings including narrowing the frequency band. The processed analog signal is then sent to an analog sampling/holding circuit 22 where the signal is sampled at a predetermined sampling interval for the following step of analog-digital (A/D) conversion and the sampled signal level is temporarily held. A Nyquist interval is adopted for the sampling interval. The Nyquist interval is the maximum interval required to satisfy the sampling theorem. According to the sampling theorem, information on an original signal will not be lost in so far as the signal is sampled at a frequency of at least twice the frequency within the frequency bandwidth thereof. The signal sampled by the analog sampling/holding circuit 22 is then sent to an A/D converter 23 where the signal is quantized and converted into a digital signal.

The digital signal converted by the A/D converter 23 is then sent to a digital signal processing circuit 24. The digital signal processing circuit 24 detects any phase error in the digital signal sent from the A/D converter 23 with regard to a carrier signal generated from a carrier signal generating circuit 25. When a phase error is detected by the digital signal processing circuit 24, the sampling interval in the analog sampling/holding circuit 22 is adjusted through a timing adjusting circuit 26, so as to synchronize the phase at the sampling point of the carrier signal with that of the transmitted signal.

The operation of such a phase adjusting circuit will be described with reference to FIG. 7.

Figure 7:
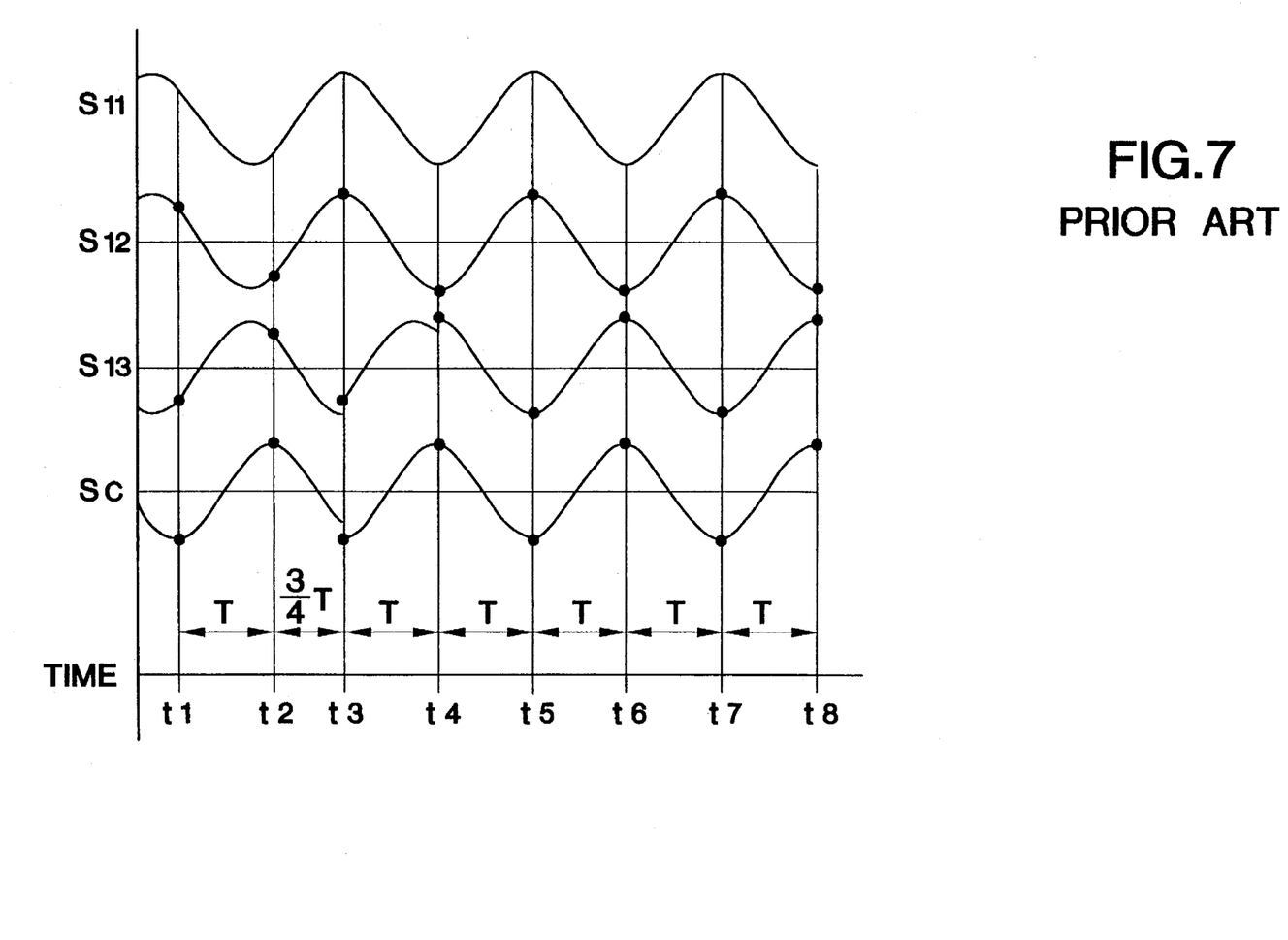
FIG. 7 is a time chart showing an operation of the phase adjusting circuit of FIG. 6.

A transmitted signal $S_{11}$ output from the analog signal processing circuit 21 is assumed to be a cosine wave having a frequency f as shown in FIG. 7. The frequency f is a modulated carrier-signal frequency. The sampling interval at the analog sampling/holding circuit 22 is therefore the interval T represented by the equation of:

$$T = \frac{1}{2} f \quad (1)$$

The carrier signal generating circuit 25 generates a carrier signal $S_c$ which is also a cosine wave having the same frequency f as the modulated carrier-signal frequency. The analog sampling/holding circuit 22 effects sampling when the phase angle of the carrier signal $S_c$ is 0° or 180°.

Assume that the analog sampling/holding circuit 22 samples the transmitted signal $S_{11}$ at the phase angle of 45° at time $t_1$ in order to output a sampled signal $S_{12}$. A time corresponding to one sampling interval is required until the sampled signal $S_{12}$ output from the analog sampling/holding circuit 22 is quantized by the A/D converter 23 and output therefrom as a digital signal $S_{13}$ to the digital signal processing circuit 24. When the digital signal processing circuit 24 detects the phase error of 45° (one-fourth of the interval T) in the digital signal $S_{13}$, the timing adjusting circuit 26 instructs the analog sampling/holding circuit 22 to shorten the next sampling interval to three-fourths of the interval T. As a result, the sampling interval between time $t_2$ and time $t_3$ is shortened so as to adjust the phase error. Thus, though the transmitted signal $S_{11}$ is still sampled at the phase angle of 225° at time $t_2$, it can be sampled at the phase angle of 0° or 180° at and after time $t_3$. Since the output of the digital signal $S_{13}$ from the A/D converter 23 is delayed by one sampling interval behind the sampling time, it is at and after time $t_4$ that the phase of the digital signal $S_{13}$ synchronizes with that of the transmitted signal $S_{11}$.

In recent years, a technique of combining an over-sampling system and a delta-sigma ($\Delta\Sigma$) modulation system has been developed so that the frequency distribution of quantized noise can be dispelled to a high-level range beyond the frequency band of a transmitted signal, thereby improving the resolution of the signal at phase adjustment.

In the over-sampling system, however, the sampling is performed at such a high frequency for example as much as 32 or 64 times the Nyquist frequency, and thus the sampling interval is very short. Accordingly, when the over-sampling system is adopted for the demodulator, the phase adjustment through the PLL circuit as described above is not possible with the conventional phase adjusting circuit as shown in FIG. 6 unless a device operable at a considerably high speed is used. Even when such a high-speed device is used, the over-sampling system requires an additional step of filtering a digital signal by a digital filter after the A/D conversion so as to narrow the frequency band of the signal within the range where digital signal processing is possible. This step causes a time delay and results in degrading the performance of the PLL circuit.

SUMMARY OF THE INVENTION

The phase adjusting circuit for a demodulator of this invention comprises A/D converting means for converting an input analog signal to a digital signal; digital filter means for narrowing the frequency band of the digital signal converted by the A/D converting means to output a filtered digital signal; digital sampling/holding means for decimating sampling components of the filtered digital signal to output a decimated digital signal; and phase locked loop means for detecting a phase error of the decimated digital signal and controlling the number of sampling intervals to be skipped by the digital sampling/holding means.

Alternatively, a phase adjusting circuit for a demodulator of this invention comprises: A/D converting means for converting an input analog signal to a digital signal; plurality N digital filter means for narrowing the frequency band of the digital signal to output a filtered digital signal; plurality N digital sampling/holding means for decimating sampling components of the filtered digital signal to output a decimated digital signal; and phase locked loop means for detecting a phase error of the decimated digital signal and controlling the number of sampling intervals to be skipped by at least one of the N digital sampling/holding means;

wherein the digital signal converted by the A/D converting means is input to a first one of the N first digital filter means, a digital signal output from an nth one (1≦n≦N) of the N digital filter means is input to an nth one of the N digital sampling/holding means, a digital signal output from an mth one (1≦m≦N−1) of the N digital sampling/holding means is input to an (m+1)th one of the N digital filter means, and a decimated digital signal output from the last one of the N digital sampling/holding means is input to the phase locked loop means. Here, N is an integer 2 or greater.

According to the phase adjusting circuit of the present invention, an analog signal is converted to a digital signal by the A/D converting means and the frequency band of the digital signal is narrowed by the digital filter means. Thereafter, the digital signal is decimated by skipping an appropriate number of sampling intervals by the digital sampling/holding means. The phase locked loop means detects a phase error of this decimated digital signal on the basis of the carrier signal generated in the phase locked loop means, and controls the number of sampling intervals to be skipped by the digital sampling/holding circuit so as to synchronize the phase of the carrier signal with that of the digital signal.

Thus, the invention described herein makes possible the advantage of providing a phase adjusting circuit for a demodulator capable of adopting the over-sampling demodulation system without being affected by a delay caused by digital filter means required for the system and with an ability of effecting phase adjustment at a sufficiently long sampling interval as in the case of not adopting the over-sampling system.

This and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference of the accompanying drawings.

EXAMPLE 1

Figure 1:
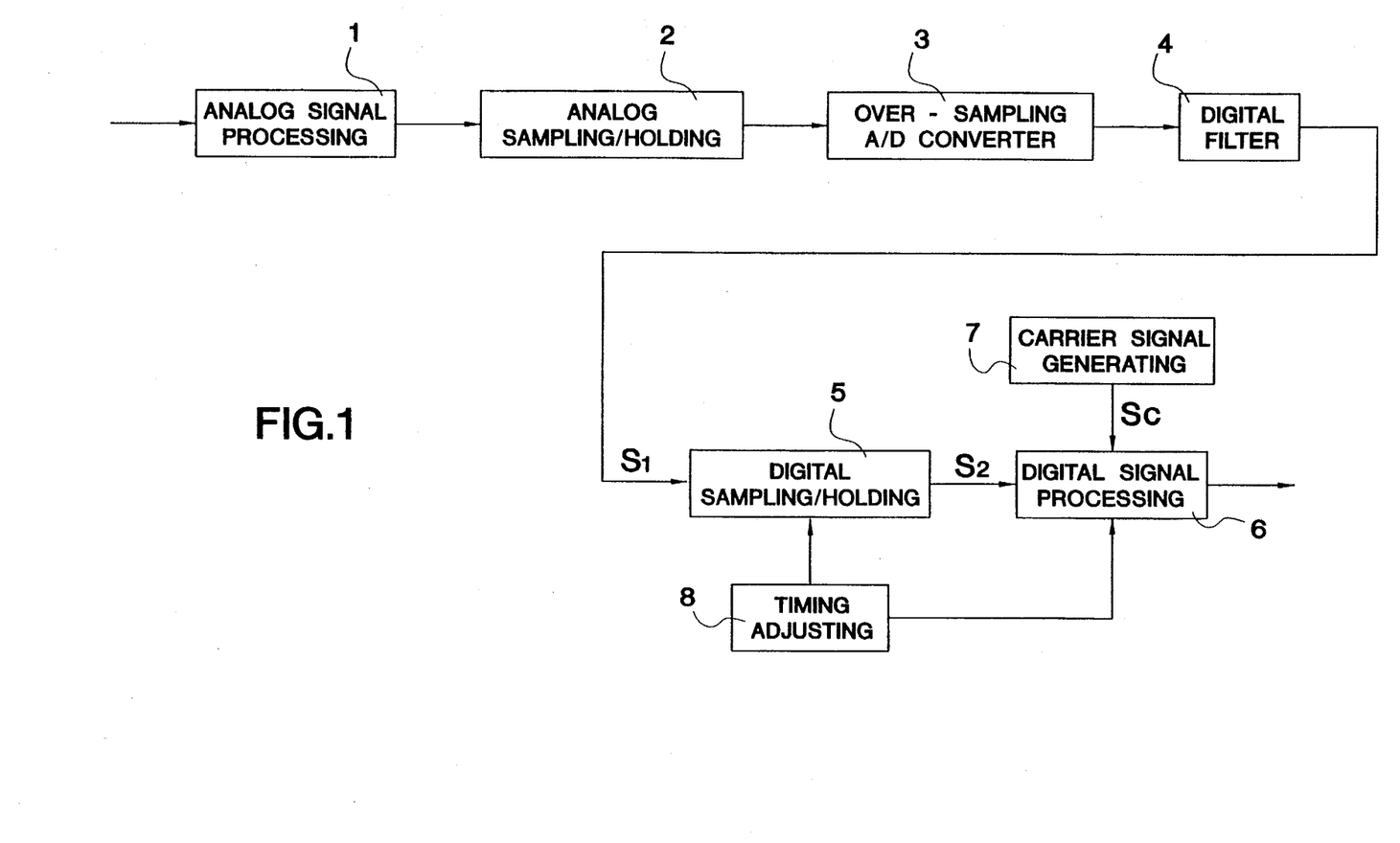
FIG. 1 is a block diagram showing a phase adjusting circuit for a demodulator according to the present invention.

FIG. 1 is a block diagram of a phase adjusting circuit for a demodulator according to the present invention. An analog signal transmitted to the demodulator is first input to an analog signal processing circuit 1 where the signal is subjected to necessary processings including narrowing the frequency band. The output of the analog signal processing circuit 1 is connected to an analog sampling/holding circuit 2.

In the analog sampling/holding circuit 2, the processed analog signal is sampled at a predetermined sampling interval for the following step of A/D conversion, and the sampled signal level is temporarily held therein by means of a capacitor or the like. This sampling is performed at a considerably higher frequency than the Nyquist frequency so as to effect over-sampling. The output of the analog sampling/holding circuit 2 is connected to an over-sampling A/D converter 3. In the over-sampling A/D converter 3, the over-sampled signal is quantized and converted into a digital signal. The output of the over-sampling A/D converter 3 is connected to a digital filter 4. In the digital filter 4, the frequency band of the converted digital signal is narrowed. The output of the digital filter 4 is connected to a digital sampling/holding circuit 5.

In the digital sampling/holding circuit 5, the sampling components of the digital signal output from the digital filter 4 are decimated, so that the sampling interval is lengthened so as to be a predetermined interval T such as the Nyquist interval. The output of the digital sampling/holding circuit 5 is connected to a digital signal processing circuit 6. In the digital signal processing circuit 6, any phase error in the digital signal from the digital sampling/holding circuit 5 is detected with respect to a carrier signal generated from a carrier signal generating circuit 7. When a phase error is detected by the digital signal processing circuit 6, the interval of components of the digital signal (decimation interval) at the digital sampling/holding circuit 5 is adjusted through a timing adjusting circuit 8 so as to adjust the phase error.

The operation of the phase adjusting circuit of this example will be described with reference to FIG. 2.

For simplification, it is assumed that the transmitted signal is a cosine wave having a modulated carrier-signal frequency f as in the case shown in FIG. 7, and that such a signal is over-sampled at four times the frequency f by the analog sampling/holding circuit 2. The sampling interval of this over-sampling is therefore one-fourth of the interval T. Thus, the transmitted analog signal is sampled at the phase angle of every 45° of the cosine wave, and after filtering through the digital filter 4, an over-sampled digital signal $S_1$ as shown in FIG. 2 is input into the digital sampling/holding circuit 5.

In the digital sampling/holding circuit 5, one sampling component for every four sampling intervals in the digital signal $S_1$ is output so as to form a decimated digital signal $S_2$ having a decimation interval corresponding to the interval T. The carrier signal generating circuit 7 generates a carrier signal $S_c$ which is also a cosine wave having the same frequency f as the modulated carrier-signal frequency. The digital sampling/holding circuit 5 outputs a sampling component of the digital signal $S_1$ only when the phase angle of the carrier signal $S_c$ is 0° or 180°, thus effecting decimation. In this description of the operation, the delay caused by the digital filter 4 is omitted for simplification.

Assume that the phase error between the transmitted signal and the carrier signal $S_c$ is 45° at time $t_1$. The digital sampling/holding circuit 5 outputs a sampling component of the digital signal $S_1$ at the phase angle of 45° at time $t_1$ so as to form the decimated digital signal $S_2$ and send it to the digital signal processing circuit 6. When the digital signal processing circuit 6 detects the phase error of 45° (one-fourth of the interval T) in the digital signal $S_2$, the timing adjusting circuit 8 instructs the digital sampling/holding circuit 5 to shorten the next decimation interval to one sampling component for three sampling intervals in the digital signal $S_1$ (three-fourths of the interval T). As a result, the decimation interval between time $t_2$ and time $t_3$ is shortened so as to adjust the phase error. Thus, though the sampling component of the digital signal $S_1$ at the phase angle of 225° is still output at time $t_2$, the sampling component at the phase angle of 0° or 180° can be output at and after time $t_3$. Thus, at and after time $t_3$, the phase of the carrier signal $S_c$ synchronizes with that of the digital signal $S_1$.

Thus, according to the phase adjusting circuit of this example, the digital signal processing circuit 6 detects a phase error of the digital signal $S_2$ decimated by the digital sampling/holding circuit 5, and the phase error is adjusted by the timing adjusting circuit 8. Accordingly, the signal processing for every interval T is also possible for the over-sampling demodulation system.

In practice, a phase error is produced between the transmitted signal and the carrier signal $S_c$ due to a delay caused by the digital filter 4. However, this phase error does not influence the above phase adjustment because it is adjusted at the stage following the digital filter 4.

EXAMPLE 2

Figure 3:
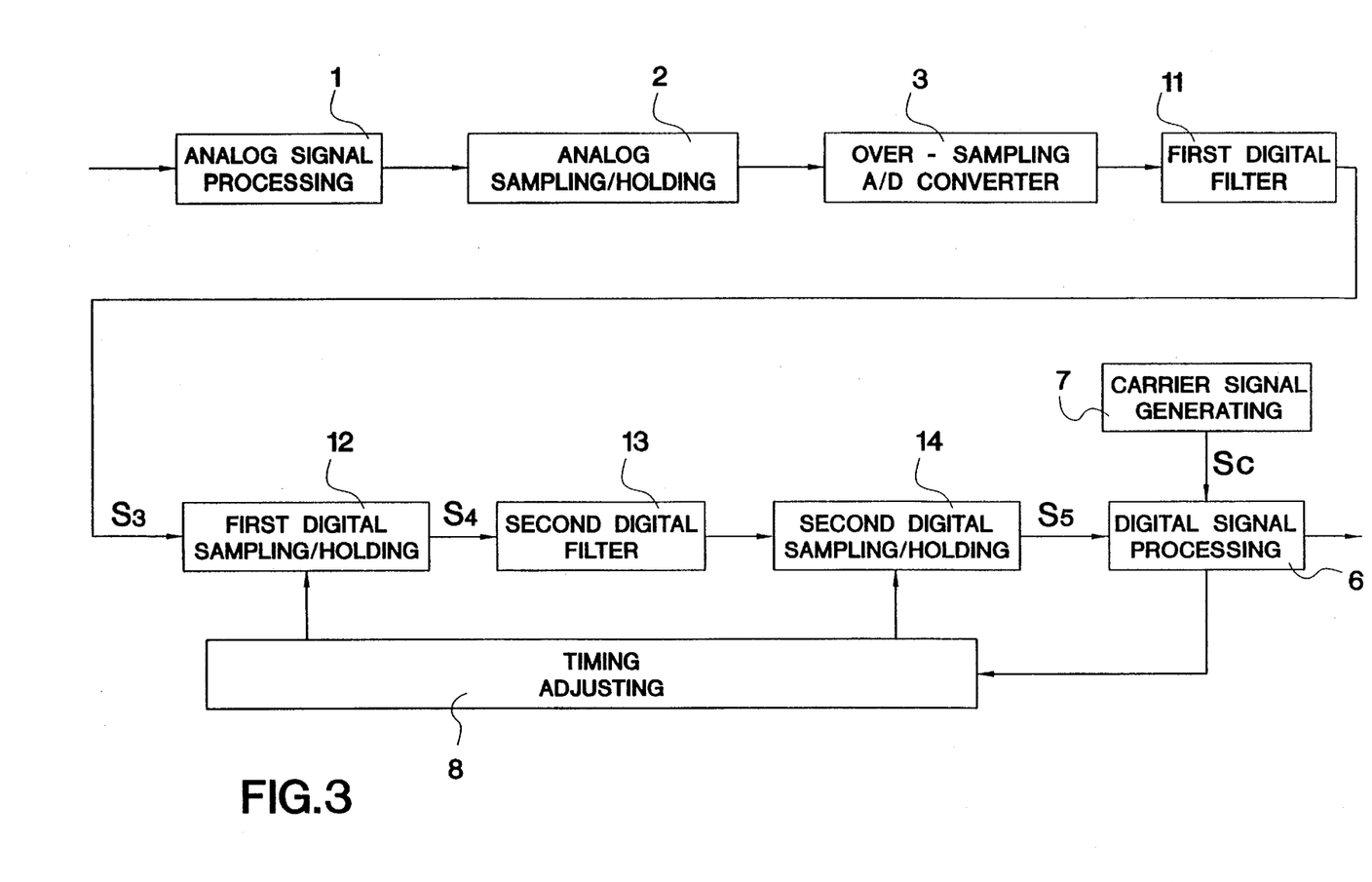
FIG. 3 is a block diagram showing another phase adjusting circuit for a demodulator according to the present invention.

FIG. 3 is a block diagram of another phase adjusting circuit for a demodulator according to the present invention. Like components are denoted as like reference numerals as in Example 1 shown in FIG. 1, and the description thereof is omitted.

In this example, the decimation of the sampling components of the digital signal output from an over-sampling A/D converter 3 is performed by two-stage digital filters and digital sampling/holding circuits so as to obtain a sampling interval long enough to allow for the processing of the digital signal. That is, first and second digital filters 11 and 13 are used in place of the digital filter 4 in FIG. 1, and first and second digital sampling/holding circuits 12 and 14 are connected to the first and second digital filters 11 and 13, respectively, for decimating the signals output from the respective digital filters 11 and 13.

Figure 4:
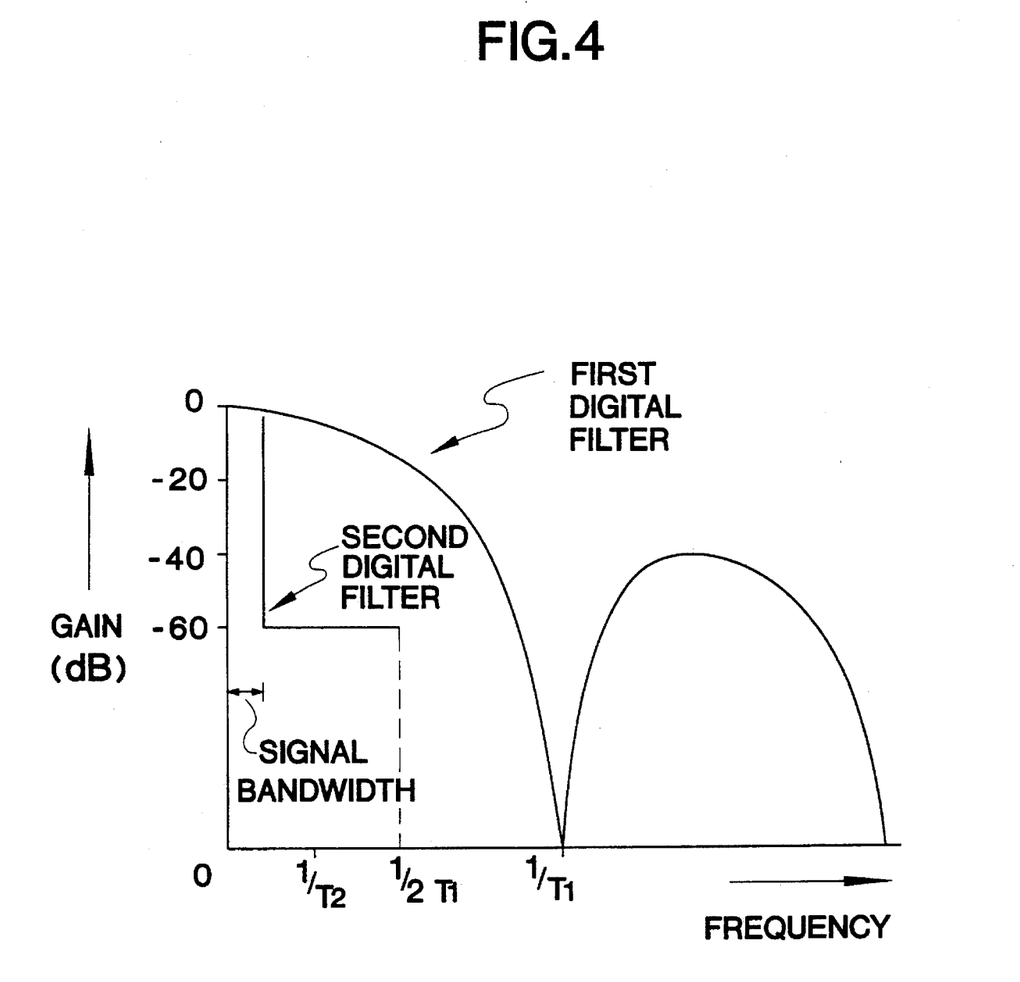
FIG. 4 shows filter characteristics of first and second digital filters used for the phase adjusting circuit of FIG. 3.

When the number of sampling intervals to be skipped by the first digital sampling/holding circuit 12 is $K_1$ and that by the second digital sampling/holding circuit 14 for the signal decimated by the first digital sampling/holding circuit 12 is $K_2$, the total number of intervals to be skipped to decimate the digital signal is $K_1 \times K_2$. For example, when a total of 400 intervals are to be skipped, a moving average filter can be used for the first digital filter 11 with $K_1$ of 100 and a finite impulse response filter for the second digital filter 13 with $K_2$ of 4 so as to obtain effective results. The characteristics of the first and the second digital filters 11 and 13 at the above setting are shown in FIG. 4.

When the sampling interval before the first-stage decimation by the first digital sampling/holding circuit 12 is $T_0$, a first decimation interval $T_1$ after the first-stage decimation is $K_1 \times T_0$. Since the sampling interval before the second-stage decimation by the second digital sampling/holding circuit 14 is $T_1$, a second decimation interval $T_2$ after the second-stage decimation is $K_2 \times T_1$. At this time, the resolution of the signal available for the adjustment of the sampling interval by the first digital sampling/holding circuit 12 is $T_0$, and that by the second digital sampling/holding circuit 14 is $T_1$. The resolution $T_0$ is higher than the resolution $T_1$ by $K_1$ times. This means that, in the phase adjusting circuit with the above structure, the phase error can be adjusted more precisely by controlling the decimation interval at the first digital sampling/holding circuit 12 than at the second digital sampling/holding circuit 14. However, when the first digital sampling/holding circuit 12 is controlled, a delay caused by the second digital filter 13 influences the phase adjustment. Therefore, in this example, in consideration of the above characteristics, the decimation interval of one or each of the first and second digital sampling/holding circuits 12 and 14 is appropriately adjusted so as to obtain the desired performance.

Figure 5:
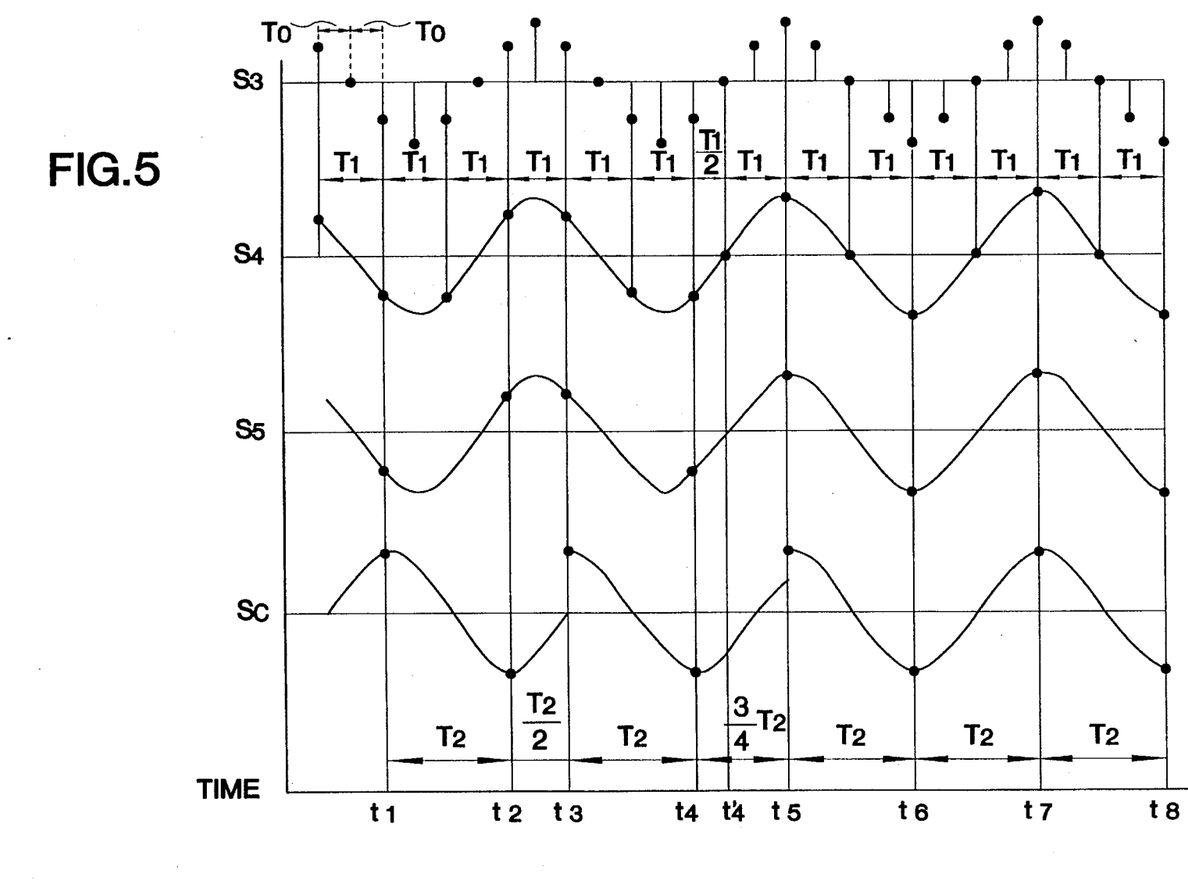
FIG. 5 is a time chart showing an operation of the phase adjusting circuit of FIG. 3.

The operation of the phase adjusting circuit of this example will be described with reference to FIG. 5.

Figure 2:
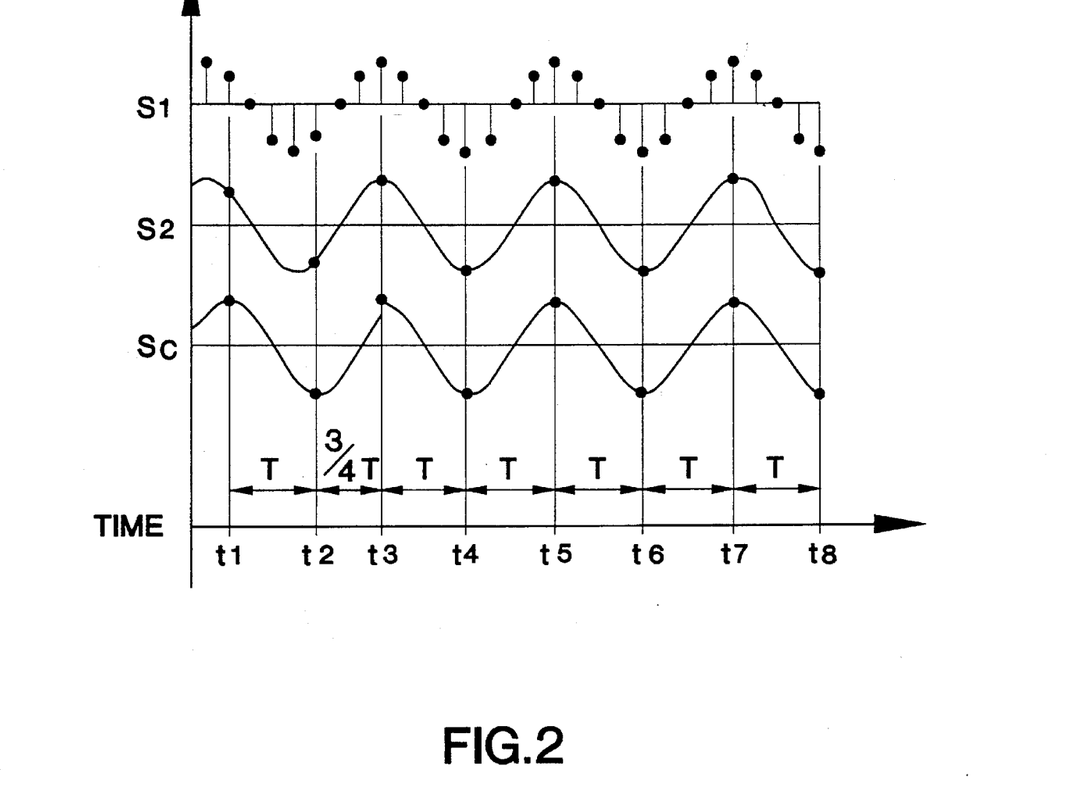
FIG. 2 is a time chart showing an operation of the phase adjusting circuit of FIG. 1.

For simplification, it is assumed that the transmitted signal is a cosine wave having a modulated carrier-signal frequency f as in the case shown in FIG. 2, and that such a signal is over-sampled by four times the frequency f by the analog sampling/holding circuit 2. Also, the numbers of intervals $K_1$ and $K_2$ to be skipped by the first and the second digital sampling/holding circuits 12 and 14, respectively, are both assumed to be 2. Delays caused by the first and the second digital filters 11 and 13 are neglected.

The sampling interval at the over-sampling is one-fourth of the interval T. Thus, the transmitted analog signal is sampled at the phase angle of every 45° of the cosine wave, and after the filtering through the first digital filter 11, a digital signal $S_3$ as shown in FIG. 5 is output to the first digital sampling/holding circuit 12. In the first digital sampling/holding circuit 12, one sampling component for every two sampling intervals in the digital signal $S_3$ is output so as to form a digital signal $S_4$ having the first decimation interval $T_1$. In the second digital sampling/holding circuit 14, one sampling component for every two first decimation intervals $T_1$ in the digital signal $S_4$ is output so as to form a digital signal $S_5$ having the second decimation interval $T_2$ corresponding to the interval T. The carrier signal generating circuit 7 generates the carrier signal $S_c$ which is also a cosine wave having the same frequency f as the modulated carrier-signal frequency. The second digital sampling/holding circuit 14 outputs a sampling component of the digital signal $S_3$ only when the phase angle of the carrier signal $S_c$ is 0° or 180°, thus effecting decimation.

Assume that the phase error between the transmitted signal and the carrier signal $S_c$ is 135° at time $t_1$. Both the first and the second digital sampling/holding circuits 12 and 14 output a sampling component of the digital signal $S_3$ at the phase angle of 135° at time $t_1$, so that the decimated digital signal $S_5$ is output from the second digital sampling/holding circuit 14. When the digital signal processing circuit 6 detects the phase error of 135° in the digital signal $S_5$, the timing adjusting circuit 8 instructs the second digital sampling/holding circuit 14 to shorten the next second decimation interval between time $t_2$ and time $t_3$ to one first decimation interval in the digital signal $S_4$ so as to adjust the phase error by 90°. As a result, the phase error is reduced to 45° at the following decimation interval between time $t_3$ and time $t_4$. Further, the timing adjusting circuit 8 instructs the first digital sampling/holding circuit 12 to shorten the next first decimation interval between time $t_4$ and $t'_4$, to one sampling interval in the digital signal $S_3$ so as to cancel the remaining phase error of 45°. Thus, at and after time $t_5$, the phase of the carrier signal $S_c$ synchronizes with that of the digital signal $S_3$.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A phase adjusting circuit for a demodulator, comprising:

A/D converting means for converting an input analog signal to a digital signal;

digital filter means for narrowing the frequency band of said digital signal converted by said A/D converting means to output a filtered digital signal;

digital sampling/holding means for decimating sampling components of said filtered digital signal to output a decimated digital signal; and phase locked loop means for detecting a phase error of said decimated digital signal and controlling the number of sampling intervals to be skipped by said digital sampling/holding means.

2. The phase adjusting circuit according to claim 1, wherein said A/D converting means adopts an over-sampling system in which said input analog signal is sampled at an interval shorter than the Nyquist interval for the conversion to said digital signal.

3. The phase adjusting circuit according to claim 1, wherein said phase locked loop means comprises:

carrier signal generating means for generating a carrier signal having the same frequency as the modulated carrier frequency of said input analog signal;

digital signal processing means for detecting the phase error of said decimated digital signal output from said digital sampling/holding means on the basis of said carrier signal generated from said carrier signal generating means; and timing adjusting means for controlling the number of sampling intervals to be skipped by said digital sampling/holding means on the basis of the phase error detected by said digital signal processing means.

4. The phase adjusting circuit according to claim 1, wherein said digital sampling/holding means lengthens the sampling interval so as to be a Nyquist interval.

5. A phase adjusting circuit for a demodulator, comprising:

A/D converting means for converting an input analog signal to a digital signal;

N digital filter means for narrowing the frequency band of said digital signal to output a filtered digital signal where N is an integer two or greater;

N digital sampling/holding means for decimating sampling components of said filtered digital signal to output a decimated digital signal; and phase locked loop means for detecting a phase error of said decimated digital signal and controlling the number of sampling intervals to be skipped by at least one of said N digital sampling/holding means;

wherein said digital signal converted by said A/D converting means is input to a first one of said N digital filter means, a digital signal output from an nth one ($1 \leq n \leq N$) of said N digital filter means is input to an nth one of said N digital sampling/holding means, a digital signal output from an mth one ($1 \leq m \leq N-1$) of said digital sampling/holding means is input to an (m+1)th one of said N digital filter means, and the decimated digital signal output from the last one of said N digital sampling/holding means is input to said phase locked loop means.

6. The phase adjusting circuit according to claim 5, wherein said A/D converting means adopts an over-sampling system in which said input analog signal is sampled at an interval shorter than the Nyquist interval for the conversion to said digital signal.

7. The phase adjusting circuit according to claim 5, wherein said phase locked loop means comprises:

carrier signal generating means for generating a carrier signal having the same frequency as the modulated carrier frequency of said input analog signal;

digital signal processing means for detecting the phase error of said digital signal output from the last one of said N digital sampling/holding means on the basis of said carrier signal generated from said carrier signal generating means; and timing adjusting means for controlling the number of sampling intervals to be skipped by at least one of said N digital sampling/holding means on the basis of the phase error detected by said digital signal processing means.

8. The phase adjusting circuit according to claim 5, wherein said phase locked loop means controls the number of sampling intervals to be skipped by at least two of said N digital sampling/holding means.

9. The phase adjusting circuit according to claim 5, wherein said N is two.

10. The phase adjusting circuit according to claim 9, wherein said A/D converting means adopts an over-sampling system in which said input analog signal is sampled at an interval shorter than the Nyquist interval for the conversion to said digital signal.

11. The phase adjusting circuit according to claim 9, wherein said first one of two digital filter means is a moving average filter and the other digital filter means is a finite impulse response filter.

* * * * *

UNITED STATES PATENT AND TRADEMARK OFFICE
CERTIFICATE OF CORRECTION

PATENT NO. : 5,483,555
DATED : January 9, 1996
INVENTOR(S) : Shinji Hattori

It is certified that error appears in the above-indentified patent and that said Letters Patent is hereby corrected as shown below:

The signal line connecting "Digital Signal Processing"
Block 6 to "Timing Adjusting" Block 8 should head toward "Timing Adjusting"
Block 8, as shown below.

Signed and Sealed this

Seventh Day of May, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,483,555
DATED : January 9, 1996
INVENTOR(S) : Shinji HATTORI

It is certified that error appears in the above-indentified patent and that said Letters Patent is hereby corrected as shown below:

FIG.1